US006956374B2

(12) United States Patent
Busse

(10) Patent No.: US 6,956,374 B2
(45) Date of Patent: Oct. 18, 2005

(54) METHOD AND APPARATUS TO REDUCE RF POWER IN HIGH FIELD MR IMAGING INCORPORATING MULTI-PHASE RF PULSE FLIP ANGLES

(75) Inventor: Reed F. Busse, San Mateo, CA (US)

(73) Assignee: General Electric Company, Milwaukee, WI (US)

( * ) Notice: Subject to any disclaimer, the term of this patent is extended or adjusted under 35 U.S.C. 154(b) by 58 days.

(21) Appl. No.: 10/612,596

(22) Filed: Jul. 2, 2003

(65) Prior Publication Data

US 2005/0001617 A1 Jan. 6, 2005

(51) Int. Cl.$^7$ .................................................. G01V 3/00
(52) U.S. Cl. ....................................................... 324/314
(58) Field of Search .............................. 324/307, 309, 324/314

(56) References Cited

U.S. PATENT DOCUMENTS

| | | | | |
|---|---|---|---|---|
| 4,901,019 A | * | 2/1990 | Wedeen ....................... | 324/309 |
| 4,970,457 A | * | 11/1990 | Kaufman et al. ........... | 324/309 |
| 5,499,629 A | * | 3/1996 | Kerr et al. ................ | 128/653.2 |
| 6,028,428 A | * | 2/2000 | Cunningham et al. ...... | 324/314 |

OTHER PUBLICATIONS

Henning, J. et al., RARE Imaging: A Fast Imaging Method for Clinical MR, Magnetic Resonance in Medicine, 1986, pp. 823–833, vol. 3.
Hennig, J., Multiecho Imaging Sequences with Low Refocusing Flip Angles, Journal of Magnetic Resonance, 1988, pp. 397–407, vol. 78.
Le Roux, P. et al., Stabilization of Echo Amplitudes in FSE Sequences, MRM, 1993, pp. 183–191, vol. 30.
Alsop, D., The Sensitivity of Low Flip Angle RARE Imaging MRM, 1997, pp. 176–184, vol. 37.
Conolly, S. et al., Variable–Rate Selective Excitation, Journal of Magnetic Resonance, 1988, pp. 440–458, vol. 78.
Hennig, J. et al., Easy Improvement of Signal–to–Noise in RARE–Sequences with Low Refocusing Flip Angles, Magnetic Resonance in Medicine, 2000, pp. 983–985, vol. 44.
Busse, R. et al., Interactive Fast Spin–Echo Imaging Magnetic Resonance in Medicine, 2000, pp. 339–348, vol. 44.
Hennig, J. et al., Echoes—How to Generate Recognize, Use or Avoid Them in MR–Imaging Sequences, Part I: Fundamental and Not So Fundamental Properties of Spin Echoes, Concepts in Magentic Resonance, 1991, pp. 125–143, vol. 3.
Pauly, J. et al., Parameter Relations for the Shinnar–Le Roux Selective Excitation Pulse Design Algorithm, IEEE Transactions on Medical Imaging, 1991, pp. 53–65, vol. 10, No. 1.
Mugler, J. III et al., Three–Dimensional T2–Weighted Imaging of the Brain Using Very Long Spin–Echo Trains, Proc. ISMRM, 2000, p. 687.

* cited by examiner

*Primary Examiner*—Brij Shrivastav
*Assistant Examiner*—Dixomara Vargas
(74) *Attorney, Agent, or Firm*—Ziolkowski Patent Solutions Group, SC; Michael A. Della Penna; Carl B. Horton

(57) ABSTRACT

A technique is set forth that is designed to reduce RF induced power in high field MR imaging that includes application of an initial contrast preserving phase of RF pulses. These initial RF pulses are designed to have a constant, relatively high flip angle over the initial contrast preserving phase. Following an effective TE, a ramp down phase is applied that has a limited number of RF pulses with a flip angle that is less than the flip angle of those in the initial contrast preserving phase. Further, the RF pulses in the ramp down phase have a flip angle that is decreased over the ramp down phase. This technique provides improved resolution and steady contrast and SNR, while significantly reducing induced RF power.

23 Claims, 3 Drawing Sheets

METHOD AND APPARATUS TO REDUCE RF POWER IN HIGH FIELD MR IMAGING INCORPORATING MULTI-PHASE RF PULSE FLIP ANGLES

BACKGROUND OF THE INVENTION

The present invention relates generally to a magnetic resonance imaging (MRI), and more particularly, to a method and apparatus for reduction of RF induced power in high field imaging using a modulated pulse sequence.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned, moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

High field imaging can theoretically provide a significant improvement in signal-to-noise ratio (SNR) compared to imaging at lower field strengths, but it is also burdened by a quadratic increase in peak and integrated RF power as a function of field strength. Therefore, at field strengths greater than 1.5 Tesla, induced RF power is a critical constraint in pulse sequence design. That is, peak power capacity of the system limits how compact a given RF pulse can be made. Further, limitations on average power induced in the patient further limits how quickly pulses can be repeated and thus, how much coverage can be attained in a given amount of time.

Certain pulse sequences, such as fast spin echo sequences, are designed to operate at or near regulatory power limits at low field strengths and therefore require particular challenges for use in high field strength to limit the amount of induced RF power. Particularly, standard 180° pulses that are used for refocusing must be limited significantly, and the advantages of high field imaging can thereby be lost.

Some common approaches to reduce RF power include using a reduced flip angle, or linearly stretching the pulses.

In the latter, RF pulses are reshaped to reduce power because the energy of an individual pulse is proportional to the integral of the square of the nutation rate, thereby reducing the bandwidth by linearly stretching the pulse as a means to reduce power while conserving total nutation angle. However, increasing the echo spacing also causes increased modulation due to relaxation. In other words, stretching RF pulses can result in longer echo spacing, but then exacerbate the effects of relaxation through the echo train, thereby resulting in degraded image quality.

A more advanced solution has been termed Variable Rate Selective Excitation (VERSE). In this technique, an RF pulse of a given nutation, duration, and bandwidth is designed by conventional means (such as a windowed sinc or optimized Shinnar-Le-Roux design), then reshaped such that high amplitude portions of the original RE pulse are stretched at a different rate than low amplitude portions of the pulse. The reshaped pulse has lower peak and total power than the original. However, this technique still suffers reduced image quality because it is sensitive to off-resonance and therefore produces weakened signals that reduce SNR in the presence of off-resonance.

Another method of reducing power in fast spin echo sequences is to reduce the nutation angle of the refocusing pulse train. While nutation angles much less than 180° can be used to generate an echo train, the signals produced oscillate and are reduced in amplitude. Additionally, reducing refocusing flip angles produces signal from stimulated echo pathways which have mixed $T_1$ and $T_2$ contrast as well as lower overall signal levels. The mixing of stimulated and spin echo signals result in signal decay, and thus image contrast, which has a $T_1$ dependence as well as $T_2$.

The problem of signal reduction and oscillation produced by low flip angle refocusing trains has been addressed by systematically varying the flip angles of the first few refocusing pulses. Such techniques allow an efficient transition of the spin system to a pseudo-steady-state which produces significantly higher signal than constant angle trains. It has also been demonstrated that by slowly varying the flip angle through the pulse train, a pseudo-steady-state condition can be maintained while manipulating the signal level received in different regions of k-space. By increasing the flip angle for acquisition of high k-space views, relaxation effects can be mitigated, and thus resolution improved. By increasing the flip angle for acquisition of low k-space views, SNR can be improved, however this also has the detrimental effect of increasing blurring.

In each of the aforementioned techniques, low angle refocusing flip angles generate significant contributions to signal from stimulated echo pathways, and this in turn, alters image contrast at a given effective echo time.

It would therefore be advantageous to have a technique capable of meeting the challenge of providing adequate coverage at high field strengths with reduced induced RF power that does not adversely affect signal, contrast, and resolution.

BRIEF DESCRIPTION OF THE INVENTION

The present invention provides a method and apparatus to reduce RF power in high field MR imaging that incorporates multi-phase RF pulse flip angles in order to overcome the aforementioned drawbacks.

The technique of the present invention reduces RF power deposition at high field strengths by implementing two complementary approaches. First, individual RF pulses and slice-select gradients are reshaped using the variable rate selective excitation (VERSE) technique, and then the flip angles of the refocusing pulse train are varied from pulse to pulse using a modulated angle refocusing train. The modulated angle refocusing train employs high flip angle pulses prior to sampling the center of k-space in order to preserve $T_2$ contrast. Low flip angles are then utilized after sampling the center of k-space to reduce power and prolong relaxation. A smooth transition is provided between the high and low flip angle phases in order to maintain the pseudo-steady-state, thereby maximizing signal and avoiding artifact-inducing oscillations. Such a pulse sequence can reduce induced RF power by 75% without affecting contrast and with only a small decrease in SNR, while providing improved resolution over prior art techniques.

Therefore, the present invention includes a pulse sequence design that reduces induced RF power having a multi-phase flip angle arrangement. The pulse sequence includes an initial contrast preserving phase that includes a number of pulses with a relatively high flip angle, and that are relatively constant, over the initial contrast preserving phase. The pulse sequence next includes a ramp down phase that has a number of pulses with a flip angle less than that of the flip angle of the pulses in the initial contrast preserving phase that decrease over time.

The invention also includes a method for reducing RF power induced in a patient during high field MR imaging. The process includes applying a set of RF pulses with relatively high flip angles to preserve $T_2$ contrast before a first TE, and then after the first TE, applying a set of RF pulses with varying flip angles that are lower than that applied before the first TE.

The invention also includes a method for correcting signal variation due to modulating the flip angle.

In accordance with another aspect of the invention, an MRI apparatus is disclosed that includes a magnetic resonance imaging (MRI) system having a plurality of gradient coils positioned about a bore of a magnet to impress a polarizing magnetic field. The MRI system also includes an RF transceiver system and an RF switch controlled by a pulse module to transmit RF signals to an RF coil assembly. The MRI apparatus further includes a computer that is programmed to apply a set of high nutation RF pulses to establish a desired $T_2$-weighted contrast at an effective echo time, acquire data, and then apply a limited set of refocusing RF pulses having lower nutation than that of the high nutation RF pulses. Upon completion of the application of the refocusing RF pulses, yet another set of RF pulses is applied that is designed to prolong relaxation.

Various other features, objects and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
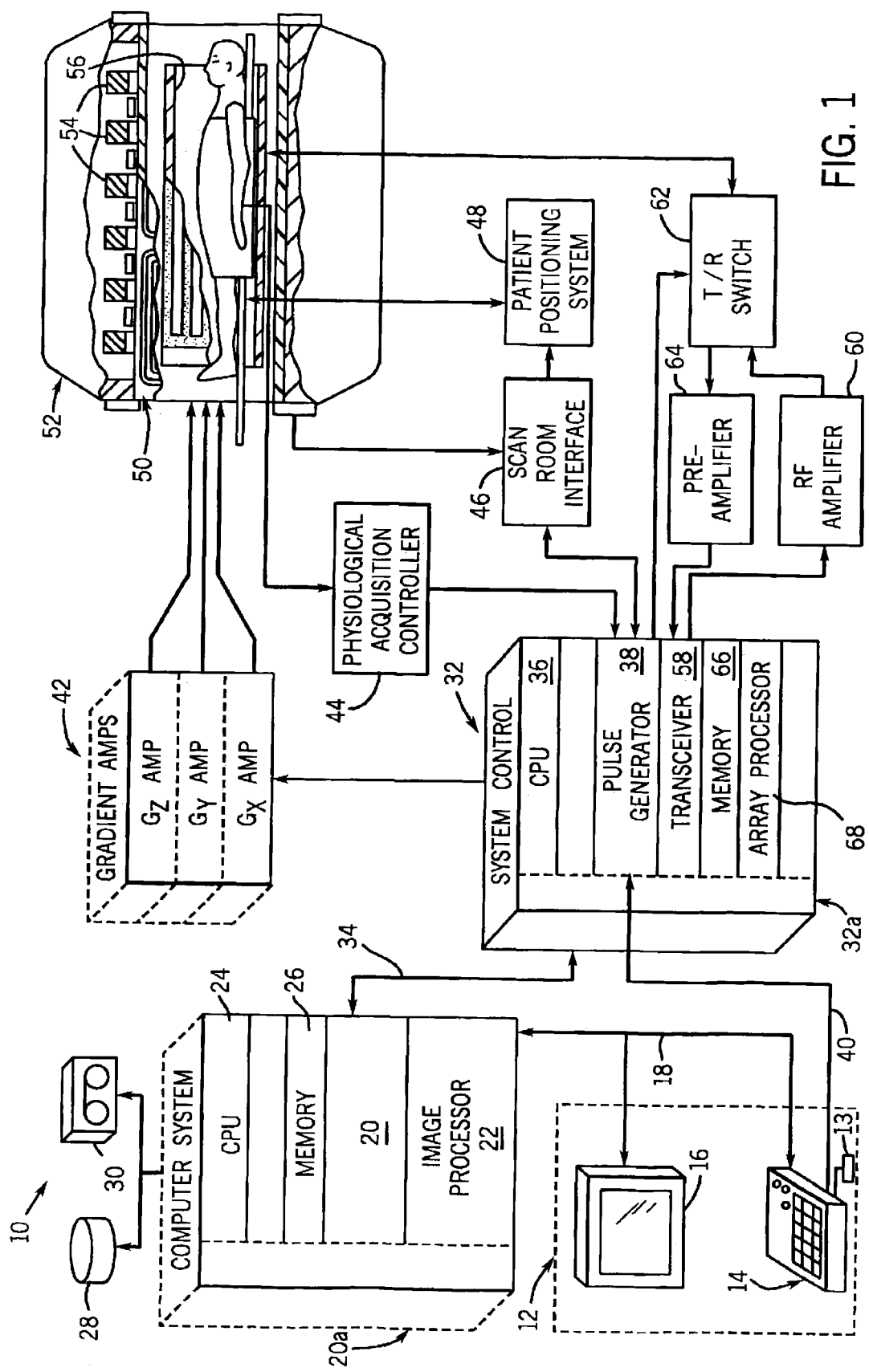
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is applicable with the above-described MRI apparatus, or any similar type of MRI apparatus. The invention is embodied in a method, a computer program, and the aforementioned MRI apparatus and is intended to reduce RF power induced in a patient during MR imaging with high magnetic fields, without the degrading image quality, by modulating the flip angle of the refocusing pulses through the pulse train. The invention includes utilizing relatively high flip angles, of relative constant value, prior to an effective echo time ($TE_{eff}$), in order to preserve $T_2$ contrast. After the effective echo time, the flip angles are then varied in a controlled fashion to take advantage of stimulated echo pathways which prolong relaxation.

In implementation, the present invention uses the aforementioned technique known as the variable rate selection excitation (VERSE) that creates a "facsimile" of various original RF pulses and slice-select gradient waveforms. Typically, the original slice-select gradient waveform is a constant gradient. After VERSE transformation, both the RF and gradient waveforms are modulated. The transformation is typically performed in order to reduce the peak and/or average power of the RF pulse. The present invention uses the VERSE technique to design an RF pulse by the well-known Shinnar-LeRoux algorithm, and then reshaping the pulse in a piecewise constant fashion and performing interpolation to resample the gradient and RF waveforms at pre-specified intervals, preferably every four $\mu$s. The reshaping algorithm can be performed on the scanner's pulse computer on a per-prescription basis. This allows the reshaping to be optimized based on the slice width (which determines the original gradient amplitude), peak gradient capacity, maximum gradient slew rate, and peak RF power.

Figure 2:
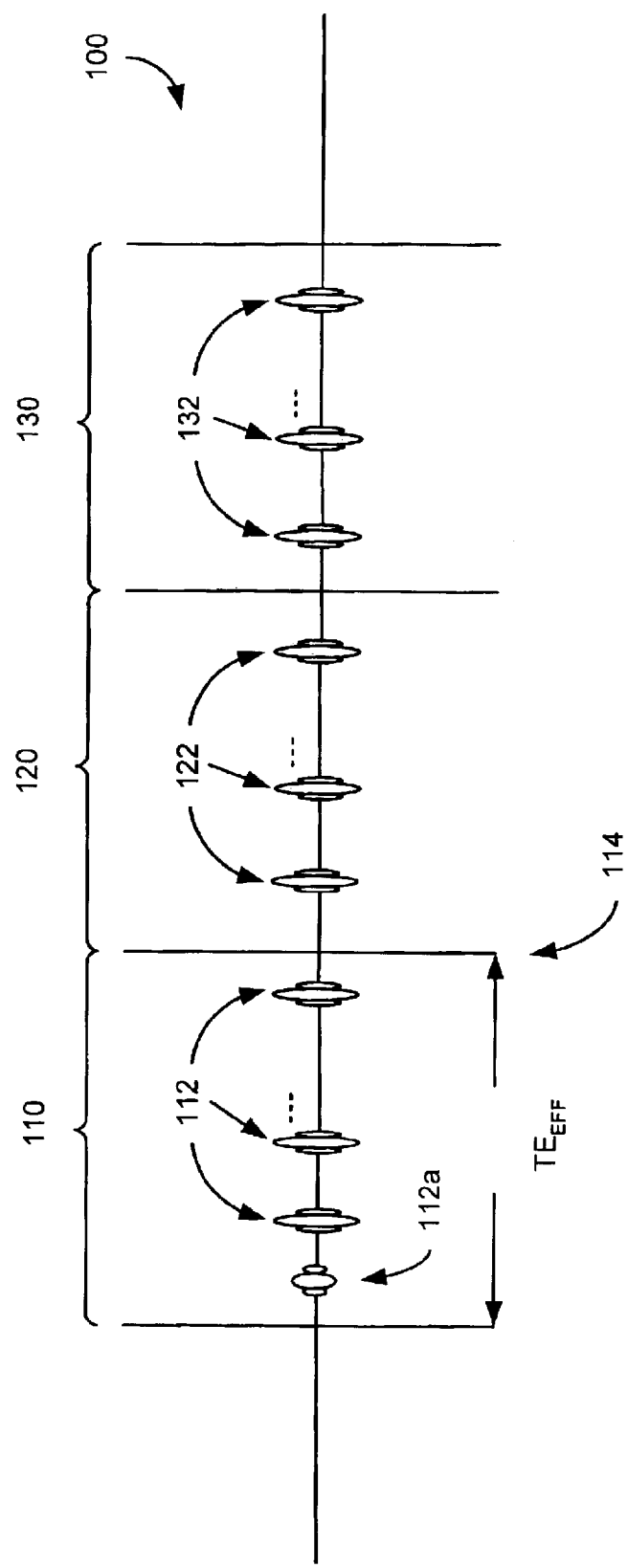
FIG. 2 is a timing diagram of a pulse sequence in accordance with the present invention.

FIG. 2 shows a pulse sequence 100 incorporating the present invention that is designed to reduce induced RF power with multi-phase flip angles that include an initial contrast preserving phase 110, a ramp down phase 120, and a relaxation prolongment phase 130. Each of these phases is defined as a phase of refocusing RF pulses, each phase having pulses with distinguishable flip angles. The initial contrast preserving phase 110 has a number of RF pulses 112 that have a relatively high flip angle, as compared to the pulses of the ramp down phase 120. Also, the flip angles for the pulses 112 in the initial contrast preserving phase 110 are held relatively constant with respect to one another. After an effective echo time $TE_{eff}$ 114, the ramp down phase 120 is played out with a number of RF pulses 122 that have a flip angle less than that of the initial contrast preserving phase 110 and that decreases over the course of the ramp down phase 120. It is understood that the effective echo time $TE_{eff}$ is the echo time in which the lowest spatial frequency is acquired, although data is acquired throughout the sequence. The multi-phase technique presented herein is not necessarily limited to such an acquisition scheme, however. Therefore, while $TE_{eff}$ includes acquisition at the lowest spatial frequency, with data acquisition occurring throughout the application of RF pulses, it is also meant to include a single acquisition of data at a given echo time.

Preferably, the pulses are of the ramp down phase decreased in a controlled manner so as to suppress transient signal behavior, and the signal variation due to modulating the flip angle is predicted and corrected prior to or during reconstruction of images from the acquired data. The pulse sequence 100 continues with the application of a relaxation prolongment phase 130 having a number of refocusing RF pulses 132 with flip angles which may be lower to reduce average power and prolong relaxation.

In a preferred embodiment, the RF pulses 112 in the initial contrast preserving phase 110 are set to have a constant, high value flip angle $\alpha$ of approximately 130°. The preferred embodiment includes an exception, in that a first pulse 112a may preferably be set at 155°, or in general, 90°+$\alpha$/2, if the high flip angle value is not 130° but some other flip angle $\alpha$.

At the conclusion of the initial contrast preserving phase, after the effective TE 114, the decreasing flip angles of the refocusing RF pulses 122 of the ramp down phase 120 are preferably chosen such that the difference between successive flip angles is described by an apodization window. For the remaining pulses 132 in the relaxation prolongment phase 130, the flip angles for the RF pulses 132 are chosen, preferably, to be a constant, relatively low value, such as 60°. Alternatively, the flip angles can be chosen to increase such that the expected signal from some material such as water remains constant despite relaxation for the remainder of the echo train, but such that the refocusing flip angles do not exceed a given maximum value.

Figure 3:
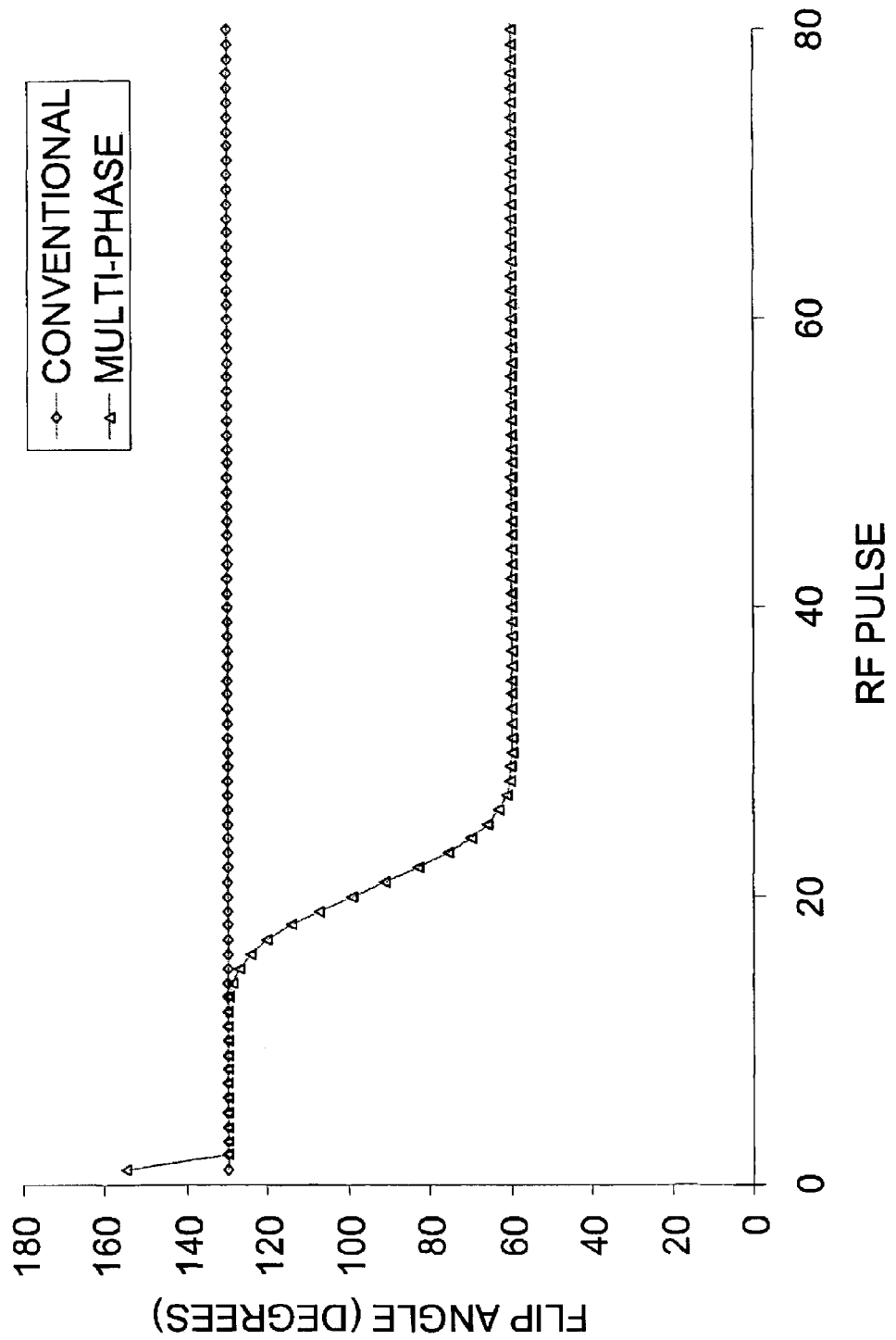
FIG. 3 is a graph of a schedule for implementing the pulse sequence of FIG. 2.

FIG. 3 is an exemplary schedule for modulating the refocusing flip angles 122 of the ramp down phase 120 shown in FIG. 2. That is, FIG. 3 shows a relationship of the desired flip angles for each refocusing RF pulse. While various techniques are contemplated for the reduction in flip angles, the present preferred embodiment is to reduce the flip angle with a windowed ramp, as described below.

It is noted that in designing a schedule of refocusing flip angles, several factors/criteria must be considered. These include the fact that (1) the power of an RF pulse is proportional to the square of the flip angle, provided the pulse is preserved in width and shape; (2) high refocusing flip angles minimize the contribution of simulated echo pathways, thus the signal evolution is primarily due to T2; (3) low refocusing flip angles increase the contribution of stimulated echo pathways, thus signal evolution is influenced by T1 and relaxation is prolonged; (4) image contrast is determined by the history of the spin system prior to the sampling of the center of k-space, but not afterwards; and (5) in the pseudo-steady-state, signal is non-oscillatory and maximized for a given flip angle.

Given these observations, a modulated angle refocusing train can be developed that employs (a) high flip angle pulses prior to sampling the center of k-space in order to preserve T2 contrast, (b) low flip angles after sampling the center of k-space to reduce power and prolong relaxation, and (c) a smooth transition between the high and low flip angle regimes in order to maintain the pseudo-steady-state, maximizing signal and avoiding artifact-inducing oscillations.

In order to establish and maintain the magnetization in the pseudo-steady-state, a windowed ramp approach is used.

Two variations are utilized—full window and half window ramps. A full window ramp is used to transition from contrast-preserving $\alpha_{high}$ to low-power $\alpha_{low}$. Refocusing flip angles are decreased from pulse to pulse over $N_{trans}$ steps such that the change in flip angle at each step, $\Delta\alpha_i$, is described by an apodized window which is normalized such that $\Sigma\Delta\alpha_i=(\alpha_{low}-\alpha_{high})$. The series of angles is then generated by setting $\alpha_1=\alpha_{high}$, and iterating $\alpha_i=\alpha_{i-1}+\Delta\alpha_i$.

A half window ramp is used to initially establish pseudo-steady-state conditions. Conceptually, $\Delta\alpha_i$ is described by the decreasing half of an apodized window. In practice, this may be accomplished by generating a window of width $2N_{estab}+1$, and normalizing such that $\Sigma\Delta\alpha_i=2(\alpha_{high}-180°)$. If $\alpha_1$ is set to 360°-$\alpha_{high}$ and the next $2N_{estab}+1$ pulses are iteratively calculated as before, a set of flip angles is generated such that the first half are greater than 180° and the second half are less than 180°. Only the second half are used for pseudo-steady-state catalyzation. A half window ramp is effective for initial catalyzation due to symmetry, ($\alpha$=180°+$\delta$ and $\alpha$=180°-$\delta$ are functionally equivalent), and because the 90° excitation pulse acts equivalently to an echo generated by a 180° refocusing pulse. Executed in reverse, it may also be used to restore magnetization to a pure transverse state for a "fast recovery" or "driven equilibrium" sequence.

This windowed ramp approach performs better than linear ramps in terms of maintaining the pseudo-steady-state and avoiding signal oscillations and is simpler than iterative numerical techniques to determine a series of refocusing angles appropriate to catalyze a pseudo-steady-state for a given refocusing flip angle.

When designing RF pulses, slice profile is commonly compromised to achieve a reasonably short pulse width. While a conventional, fixed bandwidth pulse has a duration that is directly proportional to the time-bandwidth product, it is worth noting that for a variable-bandwidth pulse designed according to the present invention, this is not the case. As the time-bandwidth of a pulse is increased, the main-lobe (high B1) is generally unaffected, while more side-lobes (low B1) are added. Because the side-lobes occur during the high bandwidth portion of the reshaped pulse, extra time-bandwidth can be added at relatively little expense. Accordingly, while the invention does not require altering the design of the original RF pulse, additional advantages can be ascertained by doing so. Accordingly, the preferred embodiment includes an appropriate RF pulse designed by the well-known Shinnar-LeRoux (SLR) method of RF pulse design, and then reshaping it with the aforementioned VERSE technique in order to reduce RF power while maintaining a compact RF waveform.

The technique used to correct the signals for the effects of flip angle modulation will now be described in detail. With the proposed technique, two separable effects result in the modulation of k-space: relaxation, $f_{relax}$, and pseudo-steady-state, $f_{pss}$ and is given as:

$$S_i = S_0 f_{pss}(\alpha_i) f_{relax}(t, T1, T2, \tau(\alpha_1, \ldots, \alpha_i)) \quad \text{(Eqn. 1)}$$

Relaxation at time t depends not only on tissue parameters T1 and T2, but also on the previous refocusing flip angles, $\alpha_1$ to $\alpha_i$, which control the time fraction, $\tau$, an isochromat has spent in the transverse plane. Relaxation effects can be reduced but not eliminated by known linear methods and such correction is not attempted by this present technique.

The signal variation in the pseudo-steady-state, however, is due to the geometry of the isochromats and is a function only of the refocusing flip angle according to:

$$f_{pss}(\alpha) = \left(\sin\frac{\alpha}{2}\right)^{\frac{1}{2}} P_{\frac{1}{2}}\left[\sin\frac{\alpha}{2}\left(1 + \frac{\sin^2\alpha}{8\sin^4\frac{\alpha}{2}}\right)\right] \quad \text{(Eqn. 2)}$$

where P is a Legendre function. This computationally expensive calculation can be approximated by:

$$f_{pss}(\alpha) = \left(\sin\frac{\alpha}{2}\right)^{p(\alpha)} \quad \text{(Eqn. 3)}$$

where $p(\alpha)$ is a polynomial with coefficients fit to match the exact solution. For the third order polynomial $$p(\alpha) = -9e^{-9}\alpha^3 + 7e^{-6}\alpha^2 - 1.5e^{-3}\alpha + 0.612 \quad \text{(Eqn. 4)}$$

where $\alpha$ is in degrees. The approximation matches the exact solution to within 1% for a as low as 30°.

The treatment above was developed to describe the signal level after the pseudo-steady-state had been attained and the flip angle then maintained at a constant value $\alpha$. For a continuously changing $\alpha$, however, the pseudo-steady-state is not stationary but migrating with the change in flip angle. It was found that extrapolating an effective $\alpha$ at the time of the echo provides a more accurate prediction of signal level using Eqns. 2 or 3 then using the $\alpha$ of the most recent RF pulse. Given echo(i) following RF(i), the effective $\alpha$ at echo(i) is calculated as:

$$\alpha_{echo(i)} = \alpha_{RF(i)} + \frac{1}{4}(\alpha_{RF(i+1)} - \alpha_{RF(i-1)}) \quad \text{(Eqn. 5)}$$

The second term is simply the extrapolated change in the effective $\alpha$ between RF(i) and echo(i). While the expression is non-causal, it should be understood that it is not meant to imply that the signal at a given echo depends on the RF pulse following the echo; rather the expression provides an estimate of the local derivative for a smoothly varying function.

In order to correct the raw signal for refocusing flip angle modulation, the effective flip angle at echo i is estimated based on Eq 5, the expected pseudo-steady-state signal dependence on this flip angle is calculated based on Eq. 3, and this is then inverted to generate a k-space correction function.

$$k_{corr}(i) = \frac{1}{f_{pss}(\alpha_{echo(i)})} \quad \text{(Eqn. 6)}$$

The invention was implemented and experiments performed on a 3T GE Signa VH/i whole body imager available from GE Medical Systems (Waukesha, Wis.). A single-shot fast spin echo (SSFSE) pulse sequence was modified to incorporate this technique. The image reconstruction program was also modified to enable a k-space correction filter generated by the pulse sequence program on a per-prescription basis to be used.

Experiments verified that the simulations accurately predict the behavior of the spin system. For this experiment, a bottle of water was placed in a transmit/receive birdcage "head" coil. The phase encode gradients (and reconstruction in the phase-encode direction) were disabled to allow the signal to be measured at each echo in a single-shot experiment. The k-space correction filter calculated by the pulse sequence program to reverse the effect of flip angle modulation was applied to the data.

In further experiments, a volunteer was imaged. In subsequent scans, the same set of 20 coronal slices through the abdomen were acquired using a 256×192 matrix, 36 cm field of view, 5 mm thick slices, 90 ms TE, and TR determined by patient RF power limitations. The body coil was used for RF transmission and a four-coil torso array was used for signal reception. Baseline scans, without implementation of the invention, were compared to scans incorporating the present invention.

For a phantom experiment of this technique, the signal evolution measurements matched the numerical model. This demonstrates that, even using fairly selective refocusing pulses, modulation of the signal caused by varying the flip angle can be effectively removed provided that the flip angle schedule maintains the pseudo-steady-state.

For volunteer experiments, coverage rate was significantly improved using the technique. RF energy deposited per slice was minimally reduced to 36% of baseline value and to as much as 28%. This reduction allowed the slice repetition rate to be increased accordingly while maintaining a safe average power of 2 W/kg. In the baseline case, twenty slices were acquired in 62 seconds. With the present invention, the twenty slices were acquired in as little as 15 seconds, easily achievable in a breath hold.

The present invention has been described in terms of the preferred embodiment, and it is recognized that equivalents, alternatives, and modifications, aside from those expressly stated, are possible and within the scope of the appending claims.

What is claimed is:

1. An MR pulse sequence designed to reduce induced RF power with multi-phase flip angles comprising:

an initial contrast preserving phase having a number of pulses with a relatively high flip angle that is relatively constant over the initial contrast preserving phase; and a ramp down phase having a number of pulses with a flip angle less than that of the flip angle of the number of pulses in the initial contrast preserving phase and that decreases over time.

2. The pulse sequence of claim 1 wherein al least a first pulse in the pulse sequence is applied having a flip angle greater than that of the flip angle applied in the initial contrast preserving phase.

3. The pulse sequence of claim 1 wherein the flip angle of the number of pulses in the ramp clown phase is decreased in a controlled manner.

4. The pulse sequence of claim 1 further comprising a relaxation prolongment phase having pulses with flip angles that increase in value.

5. The pulse sequence of claim 4 wherein the flip angle of the pulses in the relaxation prolongment phase is set not to exceed a given maximum.

6. The pulse sequence of claim 1 further comprising a relaxation prolongment phase having pulses with a flip angle set at a constant value.

7. The pulse sequence of claim 1 wherein the flip angles of the pulses in the initial contrast preserving phase are set at 130° after an initial refocusing pulse of 155°, and the flip angles of the ramp down phase monotonically decrease from 130° to 60° over approximately 20 RF pulses.

8. The pulse sequence of claim 1 wherein the initial contrast preserving phase is applied before an effective TE and the ramp down phase is applied after the effective TE.

9. The pulse sequence of claim 1 wherein the pulses of the ramp down phase are reshaped with variable-rate selective excitation to reduce peak and average power.

10. The pulse sequence of claim 1 wherein the flip angles of the pulses of the ramp down phase decrease by at least one of:

a linear function:

an apodization window function; and a monotonic function.

11. A method of reducing RF power induced in a patient in high field MR imaging comprising:

applying a set of RF pulses with relatively high flip angles to preserve T2 contrast before a given TE; and after the given TF, applying a set of RF pulses with varying flip angles that are lower than that applied before the given TE.

12. The method of claim 11 wherein the RF pulses applied before the given TE have relatively fixed flip angles, an those applied after the given TE have flip angles that are ramped downwardly.

13. The method of claim 12 further comprising correcting signal variation due to varying the flip angles of the RF pulses prior to reconstructing an image.

14. The method of claim 12 wherein the set of RF pulses with varying flip angles includes a RF pulses, and further comprises applying another set of RF pulses after a RF pulses are applied to prolong relaxation.

15. The method of claim 14 wherein the another set of RF pulses applied to prolong relaxation has flip angles selected to maintain constant signal from a selected material for a remainder of an echo train.

16. The method claim 15 wherein the another set of RF pulses applied to prolong relaxation has constant flip angles.

17. The method of claim 11 wherein the RF pulses having flip angles that are ramped downwardly in a controlled manner to decrease signal from water at a linear rate.

18. An MRI apparatus comprising:

a magnetic resonance imaging (MRI) system having a plurality of gradient coils positioned about a bore of a magnet to impress a polarizing magnetic field and an RF transceiver system and an RF switch controlled by a pulse module to transmit RF signals to an RF coil assembly to acquire MR images; and a computer programmed to:

apply a set of high nutation RF pulses to establish at desired T2-weighted contrast at an effective echo time (TEeff);

apply a set of refocusing RF pulses having lower nutation than that of the high nutation RF pulses;

apply another set of RF pulses designed to prolong relaxation; and acquire data throughout the RF pulse application.

19. The MRI apparatus of claim 18 wherein the another set of RF pulses has constant flip angle.

20. The MRI apparatus of claim 19 wherein the another set of RF pulses is selected to maintain constant signal front a desired substance.

21. The MRI apparatus of claim 19 further comprising a T3 magnet and an RF body coil.

22. The MRI apparatus of claim 19 wherein the high nutation RF pulses have a flip angle of approximately 130°, and the set of RF pulses applied after data acquisition has flip angles that are regularly ramped downwardly in a fast spin echo sequence having variable-rate selective excitation.

23. The MRI apparatus of claim 19 wherein the data acquired are corrected for the variation in signal strength due to application of a varying flip angle of the RF pulses.

* * * * *

UNITED STATES PATENT AND TRADEMARK OFFICE
CERTIFICATE OF CORRECTION

PATENT NO. : 6,956,374 B2
DATED : October 18, 2005
INVENTOR(S) : Busse

Page 1 of 1

It is certified that error appears in the above-identified patent and that said Letters Patent is hereby corrected as shown below:

Column 9,
Line 8, delete "al" and substitute -- at --;
Line 13, delete "clown" and substitute -- down --;
Line 37, delete ":" and substitute -- ; --;
Line 44, delete "TF" and substitute -- TE --;
Line 48, delete "an" and substitute -- and --;

Column 10,
Lines 5 and 6, delete "a" and substitute -- n --;
Line 12, after "method" insert -- of --;
Line 26, delete "at" and substitute -- a --;
Line 38, delete "front" and substitute -- from --;
Line 41, delete "T3" and substitute -- 3T --.

Signed and Sealed this

Seventh Day of February, 2006

JON W. DUDAS
*Director of the United States Patent and Trademark Office*